United States Patent
Tsai et al.

(10) Patent No.: US 6,365,064 B1
(45) Date of Patent: Apr. 2, 2002

(54) METHOD FOR EVENLY IMMERSING A WAFER IN A SOLUTION

(75) Inventors: Chung-Shih Tsai, Chiayi Hsien; Chou-Shin Jou, Hsin-Chu; Der-Tsyr Fan, Taipei Hsien, all of (TW)

(73) Assignee: Mosel Vitelic Inc., Hsin-chu (TW)

( * ) Notice: Subject to any disclaimer, the term of this patent is extended or adjusted under 35 U.S.C. 154(b) by 0 days.

(21) Appl. No.: 09/198,307

(22) Filed: Nov. 23, 1998

(30) Foreign Application Priority Data

Oct. 15, 1998 (TW) ........................................ 87117159 A

(51) Int. Cl.⁷ ............................................... H01L 21/00
(52) U.S. Cl. ............................. 216/91; 134/32; 134/2; 134/3; 134/15; 134/22.19; 134/25.1
(58) Field of Search ........................... 134/2, 15, 22.19, 134/3.14, 25.1, 32, 42, 902; 216/91; 204/212

(56) References Cited

U.S. PATENT DOCUMENTS 3,964,957 A * 6/1976 Walsh ........................ 156/345
5,795,405 A * 8/1998 Harnden ..................... 134/25.4
6,051,116 A * 4/2000 Ichinose et al. ............. 204/212

* cited by examiner

*Primary Examiner*—Randy Gulakowski
*Assistant Examiner*—M. Kornakov
(74) *Attorney, Agent, or Firm*—Winston Hsu

(57) ABSTRACT

The present invention provides a method for evenly immersing a wafer in a solution held in a solution chamber, which comprises the following steps: (1) placing at least one disk-shaped wafer inside a wafer holder which is used for vertically holding at least one wafer, (2) immersing the wafer holder into the solution vertically so that each wafer in the wafer holder can be vertically immersed into and react with the solution, (3) vertically rotating the wafer holder in the solution so as to invert each wafer in the wafer holder upside down, and (4) removing the wafer holder from the solution vertically after immersing the wafer in the solution for a predetermined period of time.

5 Claims, 3 Drawing Sheets

METHOD FOR EVENLY IMMERSING A WAFER IN A SOLUTION

BACKGROUND OF THE INVENTION

1. Field of the Invention

The present invention relates to a method for immersing a wafer in a solution.

2. Description of the Prior Art

Wet etching is the most commonly used method in the manufacturing of a semiconductor wafer. This method requires immersion of the semiconductor wafer in an organic solution followed by etching. How etching is performed depends on the chemical reaction between the film on the surface of the wafer and the solution. The outcome of the reaction affects the yield and is highly dependent on how evenly exposed to solution the wafer is.

Usually, several semiconductor wafers are simultaneously immersed into an organic solution. The reactants in the solution pass by diffusion through the interface boundary layer to reach the surface of the film to be etched where they react chemically with constituent molecules on the surface of the film to produce various gaseous and liquid chemical compounds. Etching of the surface of the film is caused by the mass depletion of the constituent molecules. The products of the reaction diffuse back into solution and remain in the organic solution after etching is completed.

The primary factors affecting wet etching are the concentration of the solution, the temperature of the reaction, the period of reaction, and the type of stirring. If the concentration of the organic solution or the temperature of the reaction is high, then the rate of the etching will be high. But if the reaction is too fast, it will cause serious undercut and that part of the film to be preserved may become inadvertently etched. On the other hand, if the rate of the reaction is slow, the overall etching process will take more time. Proper stirring produces convection in the organic solution which reduces the thickness of the interface boundary layer. This facilitates the movement of reactants to the surface of the film and increases the rate of etching. Certain stirring methods such as ultrasonic agitation or bubbling can minimize the undercut phenomena. However, improper stirring of the organic solution will affect the stability of the whole reaction.

Please refer to FIG. 1. FIG. 1 is a schematic diagram of a semiconductor wafer 10. A semiconductor wafer 10 usually contains as many as several hundred integrated chips 12 arranged uniformly on its surface. When wet etching, it is necessary to carefully modify the etching parameters mentioned above to make all the chips 12 react properly and to provide a uniform etching environment for each chip 12. If each chip 12 is immersed in the organic solution for a different length of time or comes in contact with organic solutions of different concentrations, then each chip 12 will be etched to a different extent and the yield of the process will decrease.

In the manufacturing of semiconductor wafers, dozens of wafers 10 are immersed simultaneously into a solution chamber, left in the chamber for a predetermined period of time, then removed. This process is automatic. As the wafer 10 enters the chamber, its bottom part comes into contact with the solution first. The bottom part of the wafer 10 is also the last to leave the solution during removal from the chamber. Therefore, different segments of the wafer are exposed to the solution for different periods of time causing variation in the extent of etching. It can be seen from this example that the bottom part of the wafer 10 is more extensively etched than the top part which is immersed for a shorter period of time in the solution. Therefore, chips 12 on the various regions of the wafer are also etched to varying extents. This seriously affects the yield of the processing of the wafer 10.

In order to solve the yield problem caused by different etching of the chips 12 on the same wafer, two methods are currently used by the semiconductor industry. One is to speed up the process of putting the wafer into the solution chamber and pulling it out, the other is to decrease the concentration of the organic solution. Increasing the speed of movement will decrease the differences of immersion time, but the fast motion will cause non-uniform stirring of the solution. Decreasing the concentration of the organic solution will lower the reaction rate and, hence variation in the period of the reaction for different parts of the wafer 10 will not substantially influence the extent of etching. But low reaction rate will increase the length of time required for producing the semiconductor wafer.

SUMMARY OF THE INVENTION

It is therefore a primary objective of the present invention to provide a method for evenly immersing a wafer in a solution to solve the problem in wet etching mentioned above.

In a preferred embodiment, the present invention provides a method for evenly immersing a wafer in a solution comprising:

(1) placing at least one disk-shaped wafer inside a wafer holder which is used for vertically holding at least one wafer;

(2) immersing the wafer holder into the solution vertically so that each wafer in the wafer holder can be vertically immersed into and react with the solution;

(3) vertically rotating the wafer holder in the solution so as to invert each wafer in the wafer holder upside down; and (4) removing the wafer holder from the solution vertically after immersing the wafer in the solution for a predetermined period of time.

It is an advantage of the present invention that each portion of the semiconductor wafer is evenly immersed into solution for the same length of time so as to improve the yield of the process. Since there is no difference in the immersion time for each part of the wafer, the density of the organic solution may be increased to increase the reaction rate. This leads to an increase in the overall production rate.

This and other objectives of the present invention will no doubt become obvious to those of ordinary skill in the art after having read the following detailed description of the preferred embodiment which is illustrated in the various figures and drawings.

DETAILED DESCRIPTION OF THE PREFERED EMBODIMENT

Figure 1:
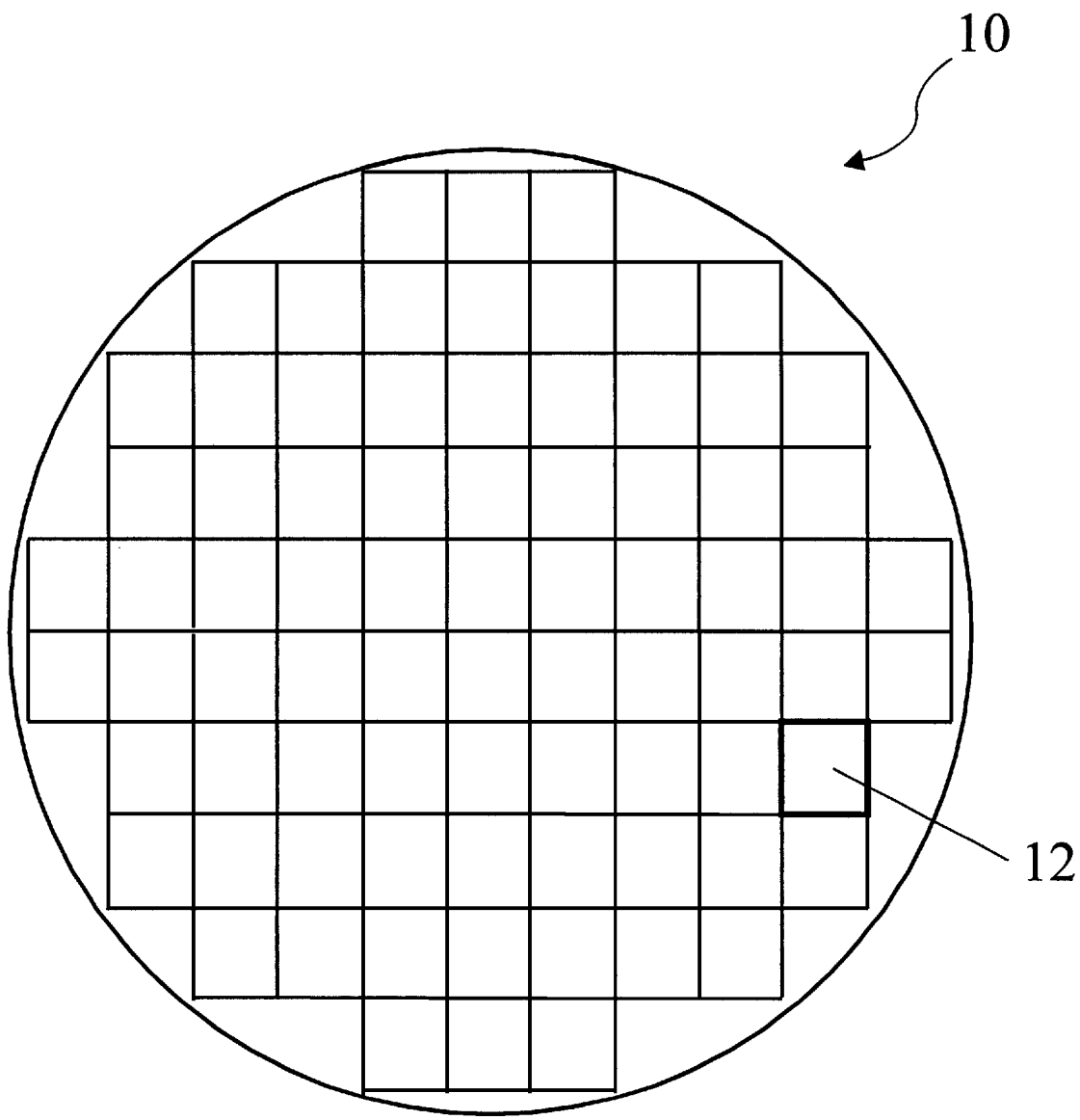
FIG. 1 is a schematic diagram of a semiconductor wafer.
Figure 2:
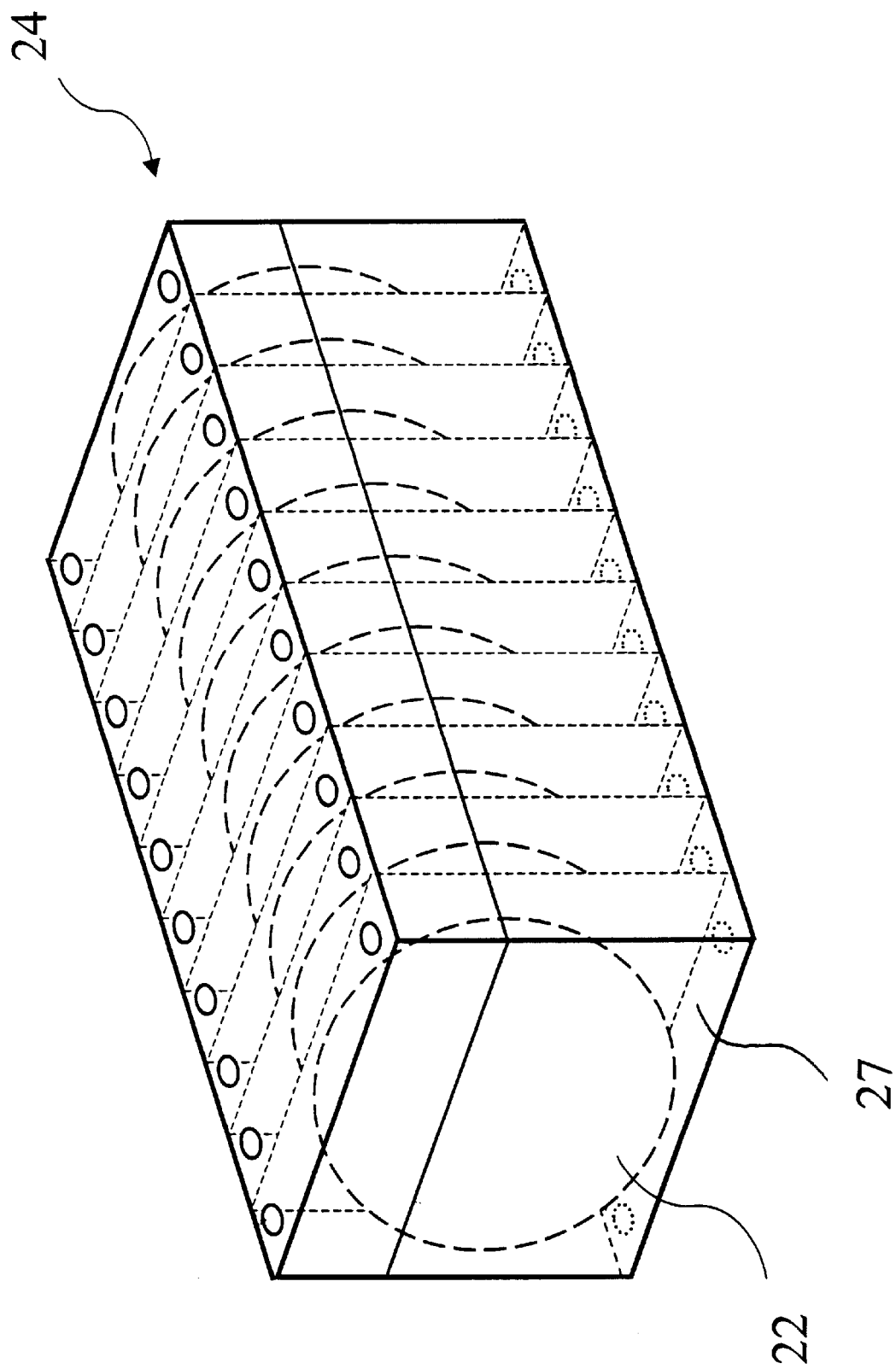
FIG. 2 is a schematic diagram of a wafer holder and semiconductor wafers for performing the method according to the present invention.
Figure 3:
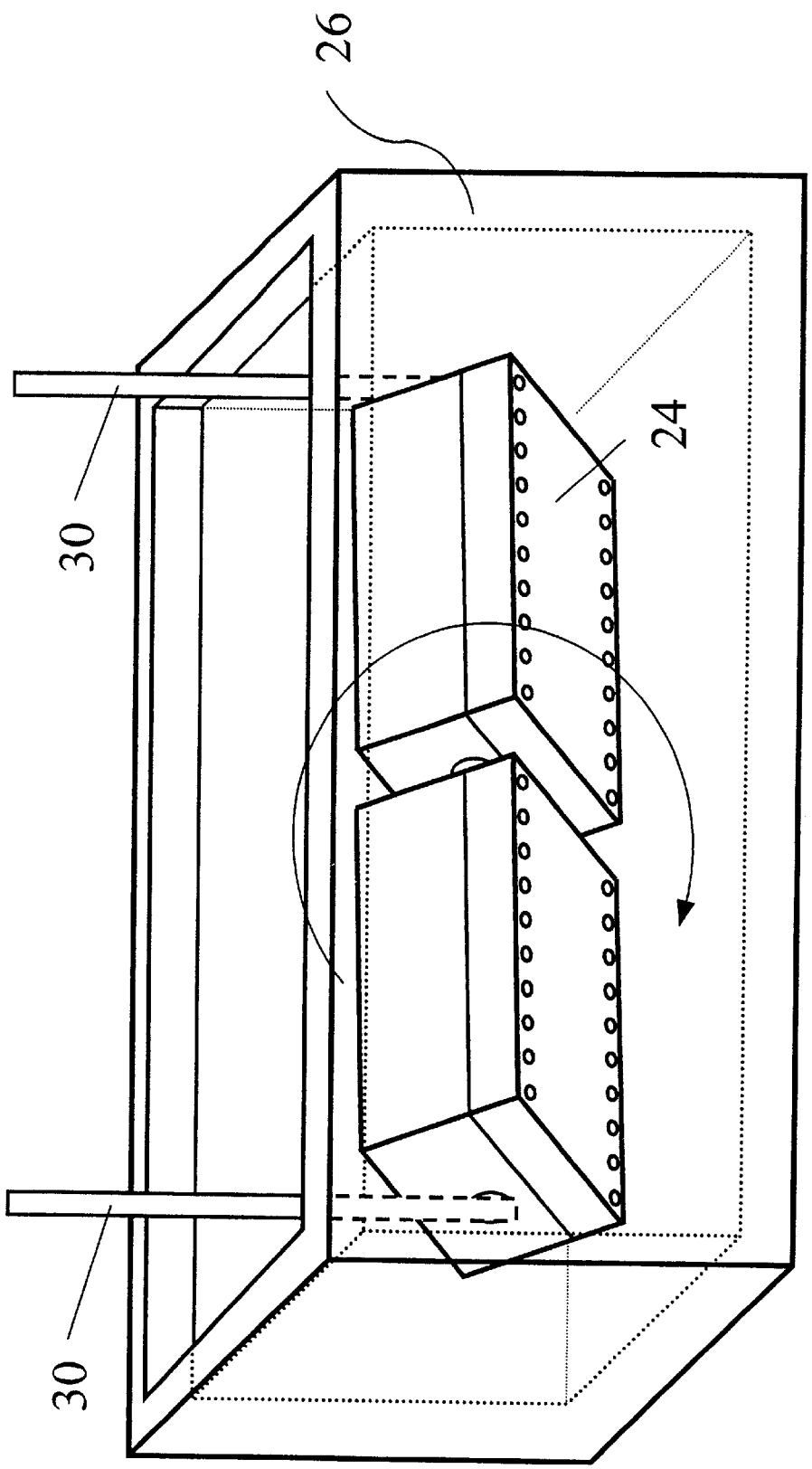
FIG. 3 is a schematic diagram of the method according to present invention.

Please refer to FIG. 2 and FIG. 3. FIG. 2 is a schematic diagram of a wafer holder 24 and semiconductor wafers 22 for performing the method according to the present invention. FIG. 3 is a schematic diagram of the method according to the present invention. The wafer holder 24 is used to fix the wafers 22 and is capable of immersing them into a solution chamber 26. Two arms 30 move the wafer holder 24. An organic solution comprising specific constituents is prepared in the solution chamber 26 and is maintained within a limited temperature range for wet etching. The wafer holder 24 further comprises a plurality of slots 27 used for vertically fixing the wafers 22 during wet etching and each slot 27 further comprises a plurality of holes on the vertical wall of the slot 27. This enables the organic solution to flow into the slot 27.

The present invention is a method for immersing a wafer 22 evenly in solution and comprises several steps. First, a plurality of disk-shaped wafers 22 is placed inside a wafer holder 24. Each wafer is fixed vertically in each slot 27 of the wafer holder 24 which is then vertically immersed along with each wafer 22 into the solution chamber 26. Next, the wafer holder 24 is rotated in the solution causing each wafer 22 in the wafer holder 24 to become inverted by 180°. Finally, the wafer holder 24 is removed from the solution vertically after a predetermined period of time. This completes the wet etching process.

The 180° angular displacement of the wafer holder 24 may be accomplished through use of the gravitational force of the wafer holder 24 itself by lowering it a specific distance. Alternatively, a rotational mechanism may be installed in the arm 30 of the wafer holder 24.

All movements during immersion of the wafer 22 in the solution chamber 26 or rotation of the wafer holder 24 by an angular displacement of 180° should be done slowly to avoid disturbances in the solution. In this way, irregular distributions of concentration of the organic solution is prevented.

In present invention method, the wafer holder 24 containing wafers 22 is immersed into the solution chamber 26 such that each wafer is completely submerged. At this time, the wafers 22 within the wafer holder 24 are rotated by 180° so that when they are removed from the solution chamber 26, the part of the wafer that first entered the solution is the part that is the last to leave. The immersion time for each part of the wafer 22 is thus uniform and reaction time of etching is likewise the same.

The immersion method of the present invention can be used not only in the wet etching process to increase the reaction rate in such processes such as contact hole or inter-layer dielectric preparation, but can also be applied to the wafer cleaning process. In the cleaning of semiconductor wafers, various cleaning agents may be used. The most commonly used solution is the weakly erosive standard cleaning solution SC-1. Alternatively, a phosphoric acid ($H_3PO_4$) or buffered HF solution with various concentrations may be used. In any case, a chemical reaction takes place on the surface of the wafer and unwanted impurities are removed. For effective cleaning, stable solution concentration and uniform immersing time are essential. Moreover, because the method of the present invention provides a uniform immersion time for each part of the wafer, the concentration of the solution may be increased to speed up the reaction time. This ultimately saves time. This method increases the stability of reactions at every part of the wafer and is suitable for any immersion process used for the semiconductor wafer.

The present invention is a wet etching method to evenly immerse each part of a semiconductor wafer for a uniform period of time so as to improve the production yield. Since there is no difference in the length of time of immersion for each part of the wafer, the reaction rate may be increased by increasing the density of the organic solution and the production rate of semiconductor wafers accordingly.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A method of immersing a wafer in a solution held in a solution chamber comprising:

(1). placing at least one disk-shaped wafer inside a wafer holder which is used for vertically holding at least one wafer;

(2). immersing the wafer holder into the solution vertically so that a wet etching or cleaning of each wafer starts simultaneously with immersion (3). vertically rotating the wafer holder in the solution so as to make each wafer in the wafer holder inverted or rotated 180° over horizontal axis; and (4). removing the wafer holder from the solution vertically after immersing the wafer in the solution for a predetermined period of time.

2. The method of claim 1 wherein the solution is a cleaning agent for cleaning each wafer in the wafer holder.

3. The method of claim 1 wherein the solution is an organic solution for etching each wafer in the wafer holder.

4. The method of claim 1 wherein when immersing the wafer holder into the solution, the wafer holder is slowly immersed into the solution to avoid causing disturbance in the solution.

5. The method of claim 2 wherein the cleaning agent is selected from the group consisting of a weakly erosive standard cleaning solution SC-1, a phosphorous acid and a buffered HF solution with various concentrations.

\* \* \* \* \*